(12) United States Patent
Srinivasan et al.

(10) Patent No.: US 9,529,663 B1
(45) Date of Patent: Dec. 27, 2016

(54) DETECTION AND LOCALIZATION OF FAILURES IN 3D NAND FLASH MEMORY

(71) Applicant: Apple Inc., Cupertino, CA (US)

(72) Inventors: Charan Srinivasan, Cupertino, CA (US); Eyal Gurgi, Herzliya Pituach (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/975,784

(22) Filed: Dec. 20, 2015

(51) Int. Cl.
*G11C 16/06* (2006.01)
*G06F 11/07* (2006.01)
*G11C 29/02* (2006.01)

(52) U.S. Cl.
CPC ......... *G06F 11/0793* (2013.01); *G06F 11/073* (2013.01); *G06F 11/079* (2013.01); *G06F 11/0751* (2013.01); *G11C 29/021* (2013.01)

(58) Field of Classification Search
CPC ... G11C 16/16; G11C 29/025; G11C 11/5635; G11C 11/5642; G11C 16/3404; G11C 16/3409; G11C 16/344; G11C 2211/5621; G11C 7/02; G11C 11/5628; G11C 16/0483; G11C 2029/1202; G11C 2029/5006
USPC .......... 365/185.03, 185.29, 185.19, 185.11,365/185.17, 185.21, 185.12, 185.18, 185.22,365/185.25, 189.05, 189.07, 189.19
See application file for complete search history.

(56) References Cited

U.S. PATENT DOCUMENTS

| | | | |
|---|---|---|---|
| 4,841,482 A | 6/1989 | Kreifels | |
| 5,181,025 A | 1/1993 | Ferguson et al. | |
| 5,331,594 A | 7/1994 | Hotta | |
| 5,372,712 A | 12/1994 | Petit | |
| 5,428,621 A | 6/1995 | Mehrotra et al. | |
| 5,440,516 A | 8/1995 | Slemmer | |
| 5,581,509 A | 12/1996 | Golla et al. | |
| 5,602,778 A | 2/1997 | Futatsuya et al. | |
| 5,606,527 A | 2/1997 | Kwack et al. | |
| 5,684,747 A | 11/1997 | Urai | |
| 5,748,545 A | 5/1998 | Lee et al. | |
| 5,796,653 A | 8/1998 | Gaultier | |
| 5,847,995 A | 12/1998 | Kobayashi et al. | |
| 5,898,637 A | 4/1999 | Lakhani et al. | |
| 6,031,772 A | 2/2000 | Nagatomo | |
| 6,545,910 B2 | 4/2003 | Byeon et al. | |
| 6,650,585 B2 | 11/2003 | Chevallier | |
| 6,707,078 B1 | 3/2004 | Shiraiwa et al. | |
| 6,813,183 B2 | 11/2004 | Chevallier | |
| 7,089,460 B2 | 8/2006 | Fu | |
| 7,212,454 B2 | 5/2007 | Kleveland et al. | |
| 7,319,623 B1 | 1/2008 | Yuan et al. | |
| 7,440,347 B1 | 10/2008 | Vogelsang | |
| 7,463,529 B2 | 12/2008 | Matsubara | |
| 8,176,284 B2 | 5/2012 | Frost et al. | |
| 8,305,807 B2 | 11/2012 | Shah et al. | |

(Continued)

OTHER PUBLICATIONS

U.S. Appl. No. 14/617,961 Office Action dated Feb. 25, 2016.

(Continued)

*Primary Examiner* — Thong Q Le
(74) *Attorney, Agent, or Firm* — D. Kligler IP Services Ltd.

(57) ABSTRACT

A method includes, in a memory block, which includes at least a string of memory cells that is selectable using at least a select transistor, sensing a current flowing through the string. A failure in the memory block, which causes the string to conduct even when unselected using the select transistor, is detected based on the sensed current. A corrective action is initiated in response to the identified failure.

18 Claims, 2 Drawing Sheets

(56) References Cited

U.S. PATENT DOCUMENTS

| | | |
|---|---|---|
| 8,379,454 B2 | 2/2013 | Kochar et al. |
| 8,432,732 B2 | 4/2013 | Li et al. |
| 8,514,630 B2 | 8/2013 | Huynh et al. |
| 8,730,722 B2 | 5/2014 | Koh et al. |
| 8,902,657 B2 | 12/2014 | Iwai et al. |
| 9,021,339 B2 | 4/2015 | Lu et al. |
| 9,058,261 B1 | 6/2015 | Jean et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,355,713 B2 | 5/2016 | Huang et al. |
| 2009/0225607 A1 | 9/2009 | Chen et al. |
| 2010/0128525 A1* | 5/2010 | Mokhlesi ............ G11C 7/02 365/185.03 |
| 2010/0329052 A1 | 12/2010 | Chen et al. |
| 2013/0294168 A1 | 11/2013 | Shirakawa |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0178150 A1 | 6/2015 | Silberman et al. |
| 2016/0034353 A1 | 2/2016 | Tuers et al. |

OTHER PUBLICATIONS

U.S. Appl. No. 14/572,818 Office Action dated Oct. 29, 2015.
Rotbard et al., U.S. Appl. No. 14/572,818 dated Dec. 17, 2014.
Shur et al., U.S. Appl. No. 14/617,961 dated Feb. 10, 2015.

\* cited by examiner

US 9,529,663 B1

DETECTION AND LOCALIZATION OF FAILURES IN 3D NAND FLASH MEMORY

TECHNICAL FIELD

Embodiments described herein relate generally to memory devices, and particularly to methods and systems for detecting and localizing memory device failures.

BACKGROUND

Various types of memory devices store data in NAND Flash memory cells that are arranged in a three-dimensional (3D) structure. These technologies are commonly known as "3D NAND." In one example configuration, the memory cells in a given plane of the 3D memory are arranged in strings. The memory cells in each string are connected to one another in a source-to-drain cascade. A source-selection transistor (referred to as SGS) and a drain-selection transistor (referred to as SGD) are connected at the source and drain ends of the string, respectively, and enable selection of the string for programming, readout or erasure.

SUMMARY

Embodiments described herein provide a method including, in a memory block, which includes at least a string of memory cells that is selectable using at least a select transistor, sensing a current flowing through the string. A failure in the memory block, which causes the string to conduct even when unselected using the select transistor, is detected based on the sensed current. A corrective action is initiated in response to the identified failure.

In an embodiment, the select transistor includes a source-select transistor (SGS) or a drain-select transistor (SGD). In another embodiment, sensing the current includes assessing the current following erasure of the memory block.

In some embodiments, sensing the current includes performing an erase-verification operation during which a gate of the select transistor is set to a positive voltage, and performing a re-read operation in which the gate is set to zero voltage, and detecting the failure includes comparing the current sensed during the erase-verification operation to the current sensed during the re-read operation. Detecting the failure may include detecting that the current sensed during the re-read operation is lower than the current sensed during the erase-verification operation by less than a pre-defined margin. In another embodiment, sensing the current includes assessing the current using a programming-and-verification (P&V) circuit that is also used for verifying programming of the memory cells with data.

In some embodiments, initiating the corrective action includes initiating programming of at least some of the memory cells in the memory block to a positive threshold voltage. In an example embodiment, programming of the memory cells includes applying to each of the memory cells a single programming pulse. In a disclosed embodiment, initiating the programming includes notifying a memory controller or host of the failure, and receiving from the memory controller or host an instruction to program the memory cells.

There is additionally provided, in accordance with an embodiment that is described herein, an apparatus including a memory and control circuitry. The memory includes at least a string of memory cells that is selectable using at least a select transistor. The control circuitry is configured to sense a current flowing through the string, to detect, based on the sensed current, a failure in the memory block that causes the string to conduct even when unselected using the select transistor, and to initiate a corrective action in response to the identified failure.

These and other embodiments will be more fully understood from the following detailed description of the embodiments thereof, taken together with the drawings in which:

DETAILED DESCRIPTION OF EMBODIMENTS

Overview

Figure 1:
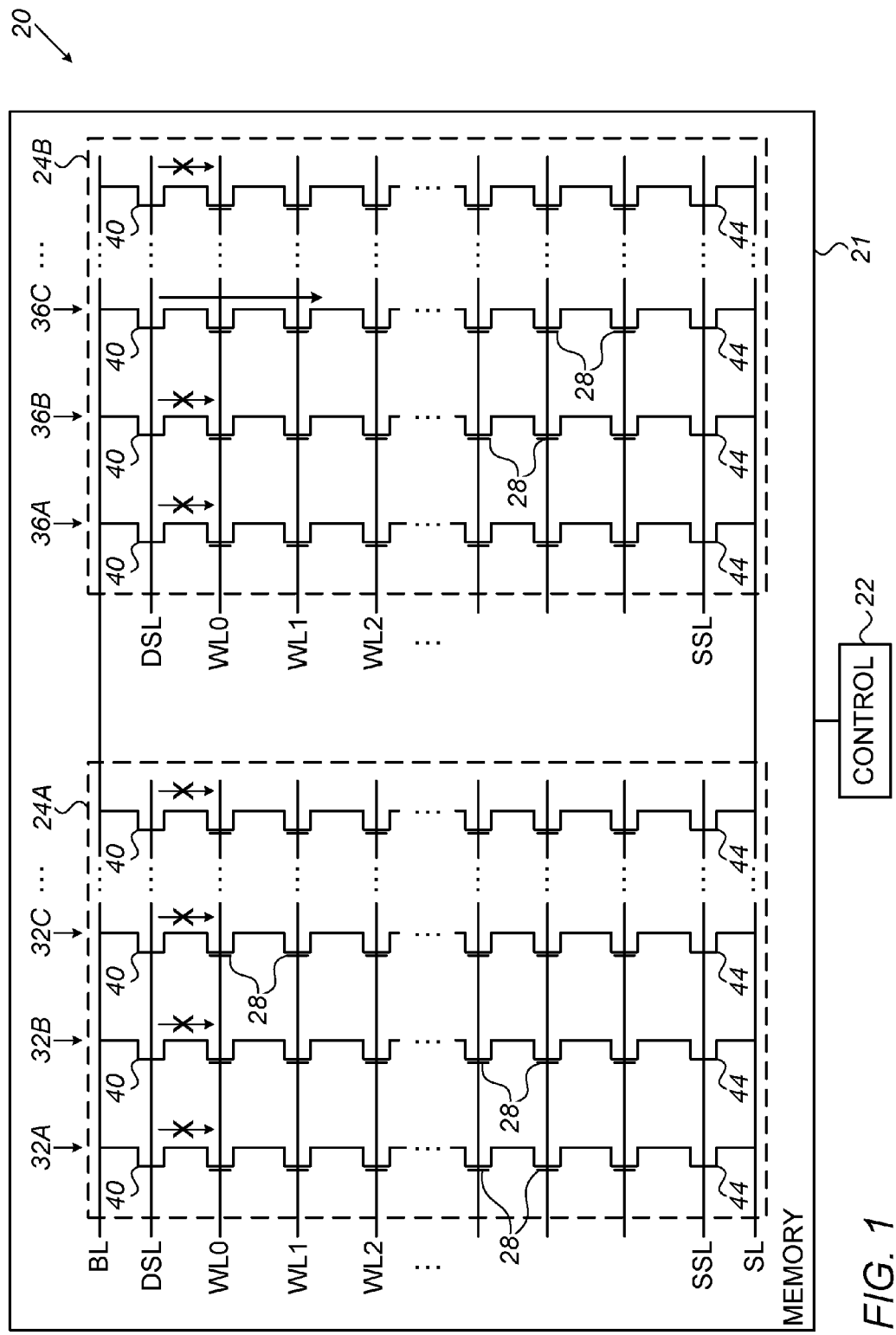
FIG. 1 is a block diagram that schematically illustrates a 3D NAND Flash memory device, in accordance with an embodiment that is described herein.

Embodiments that are described herein provide improved methods and apparatus for detecting and acting upon failures in 3D NAND Flash memory devices. In particular, some of the disclosed techniques detect failures that potentially affect an entire memory plane or die, and localize the impact of the failure to a single memory block or sub-block.

In some embodiments, a 3D memory device comprises multiple NAND Flash memory cells that are arranged in a 3D structure. Each plane in the 3D structure comprises multiple strings of memory cells that are connected between a bit-line (BL) and a source-line (SL). The memory cells in each string are connected to one another in a source-to-drain cascade. The gates of corresponding memory cells in the different strings are connected by word-lines (WLs). The source end of each string is connected to the SL via a respective source-select transistor (referred to as SGS), and the drain end of each string is connected to the BL via a respective drain-select transistor (referred to as SGD).

Each plane is typically divided into multiple memory blocks, each block comprising a respective set of strings. Each block has a source-select line (SSL) that connects to the gates of the SGSs of the strings in the block, and a drain-select line (DSL) that connects to the gates of the SGDs of the strings in the block. Each block can be selected for programming, readout or erasure, or unselected, by applying appropriate voltages to the SSL and DSL.

The embodiments described herein focus primarily on memory failures that cause a string to conduct even when unselected using the corresponding SGS and SGD. Such a failure may be caused, for example, by local defects in the memory that cause SSL or DSL discontinuity. This sort of failure is sometimes referred to as "Hi-Z failure" because it increases the SSL or DSL impedance.

A failure that causes an unselected string to conduct will typically cause excessive leakage of BL current. Since each BL is common to a large number of memory blocks, such a failure may impact an entire plane or die. Such failures are especially harmful because the memory device usually does not contain sufficient spare memory to replace a faulty plane or die. BL leakage is especially severe in erased unselected memory blocks.

In some embodiments the memory device comprises control circuitry that, among other tasks, detects failures that cause an unselected string to conduct. In one embodiment, upon erasing a memory block, the control circuitry carries out an erase-verification operation during which the WLs are subjected to a low positive voltage (e.g., 0-2V) and the SGS and SGD are subjected to some predefined positive voltage (e.g., 5V). In addition, the control circuitry performs at least one re-read operation in which the SGS voltage or the SGD voltage is set to zero. For example, the control circuitry may perform two re-read operations, one having the SGS voltage set to zero and the other having the SGD voltage set to zero.

The control circuitry senses the current flowing through the string during erase verification and during re-read, and compares the currents to one another. In a functional string, the current during re-read is expected to be significantly lower than the current during erase verification (e.g., 10 nA vs. ~50-100 nA). If the current sensed during re-read is not sufficiently lower than the current sensed during erase verification (e.g., lower by less than some predefined margin), the control circuitry concludes that the string is faulty.

In other embodiments, the memory device comprises a programming-and-verification (P&V) circuit that programs the memory cells with data and verifies whether the memory cells have reached their target programming levels. The control circuitry may use the same P&V circuit for verifying whether a given SGS or SGD suffers from Hi-Z failure or not.

In some embodiments, upon detecting a string that conducts even when unselected, the control circuitry takes measures to confine the impact of the failure to the specific memory block or sub-block. In an example embodiment, the control circuitry programs the memory block or sub-block to some positive threshold voltage in order to reduce BL current leakage through the faulty string. This programming need not be accurate, and may therefore be carried by applying a single programming pulse without verification. As a result, the remaining blocks or sub-blocks in the memory plane or die (other than the block or sub-block containing the faulty string) remain fully functional.

System Description

FIG. 1 is a block diagram that schematically illustrates a 3D NAND Flash memory device 20, in accordance with an embodiment that is described herein. Device 20 comprises a 3D memory 21 that is configured to store data, and control circuitry 22 that carries out the techniques described herein. Device 20 may be part of any suitable memory system and may be connected to any suitable memory controller or host.

Memory 21 comprises multiple NAND Flash memory cells that are arranged in a 3D structure. In some embodiments each memory cell 28 comprises a floating-gate transistor. In other embodiments the memory cells comprise charge-trap memory cells. Further alternatively, any other suitable memory technology can be used.

The 3D structure comprises multiple memory planes, each comprising multiple memory blocks 24 that in turn each comprises multiple memory cells 28. For the sake of clarity, FIG. 1 shows only two memory blocks 24A and 24B belonging to the same plane.

Each memory block in memory 21 comprises multiple strings of memory cells 28. The strings in block 24A are denoted 32A, 32B, 32C, . . . , and the strings in block 24B are denoted 36A, 36B, 36C, . . . . The strings are connected between a bit-line (denoted BL) and a source-line (denoted SL). Memory cells 28 in each string are connected to one another in a source-to-drain cascade. The gates of corresponding memory cells 28 in the different strings are connected by word-lines (denoted WL0, WL1, WL2, . . . ).

The source end of each string is connected to the SL via a respective source-selection transistor 44 (referred to as SGS), and the drain end of each string is connected to the BL via a respective drain-selection transistor 40 (referred to as SGD). The SGDs and SGSs are regarded herein as examples of select transistor for selecting and unselecting the strings.

In some embodiments, the strings are implemented in a "folded" configuration, also sometimes referred to as pipe-BiCS architecture, such that SGS 44 and SGD 40 (and also the SSL and DSL) are in close proximity to one another. Alternatively, the 3D structure may have any other suitable geometrical configuration.

Each memory block has a source-select line (SSL) that connects to the gates of the SGSs of the strings in the block, and a drain-select line (DSL) that connects to the gates of the SGDs of the strings in the block. Each block can be selected for programming, readout or erasure, or unselected, by applying appropriate voltages to the SSL and DSL.

Note that the various memory blocks of the plane (and particularly blocks 24A and 24B) share the same BL and SL. The WLs, SSL and DSL are separate per memory block.

In some embodiments, control circuitry 22 performs the various management and control tasks of memory device 20. For example, control circuitry 22 erases memory blocks, programs data into memory blocks, reads data from memory blocks, and also detects and mitigates failures as described herein. For performing these tasks, control unit 21 typically applies suitable voltages to the various lines shown in FIG. 1, e.g., BL, SL, DSL, SSL and the various WLs.

In one example embodiment, in a selected block, the control circuitry pre-charges the BL to the supply voltage (Vcc) during programming and to 0.5-1.5V during programming-verification and readout. In an unselected block, the control circuitry applies ground (0V) to the DSL and SSL, i.e., to the SGD and SGS gates. The numerical values given above are depicted purely by way of example, and any other suitable voltages can be used in alternative embodiments.

In addition, when reading data and when verifying programming or erasure operations, the control unit senses the current flowing via one or more of the strings. Sensing may be performed, for example, by charging the BL to some initial voltage, allowing the BL to discharge, and sensing the string voltage or current using one or more sense amplifiers (not shown).

The configuration of memory device 20 shown in FIG. 1 is an exemplary configuration, which is chosen purely for the sake of conceptual clarity. Any other suitable memory device configuration can also be used. Elements that are not necessary for understanding the principles of the present invention, such as various interfaces, addressing circuits, timing and sequencing circuits and debugging circuits, have been omitted from the figure for clarity.

In some embodiments, at least some of the functionality of control circuitry 22 can be implemented in software and carried out by a programmable processor that is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Mitigation of Failures Characterized by Conducting Unselected SGS/SGD

As explained above, the various memory blocks in a plane share the same BL and SL. When preparing to perform a certain operation in a given block (e.g., programming, readout or erasure), the desired block is selected by applying appropriate selection voltages to the DSL and SSL of that block (and thus to the gates of the SGDs and SGSs of the various strings in the block). The other blocks in the plane are unselected by applying a disabling voltage (e.g., ground) to their DSLs and SSLs (and thus to the gates of the SGDs and SGSs).

In a functional block, unselecting the block (e.g., by grounding the SGD and SGS gates) ensures that none of the strings in the block conducts. Therefore, unselected blocks are effectively detached from the BL and SL, and BL current may flow only via strings in the selected block.

In some cases, however, a memory block may suffer from a failure that causes one or more of its strings to conduct even when the block is unselected. Such a failure may comprise, for example, a "Hi-Z" failure caused by a local defect that causes discontinuity in the SSL or DSL. Alternatively, an unselected string may conduct current due to various other defects. For example, in some implementations, an SGD or SGS transistor may suffer from impairments such as retention, read-disturb, erase-disturb and others. All such impairments degrade the ability to cut-off the transistor properly, and can therefore be mitigated using the disclosed techniques.

Excessive leakage of BL current via an unselected string may degrade performance in various ways. For example, during programming, unselected BLs are pre-charged to Vcc. Excessive lowering of the BL voltage from Vcc may cause program-disturb on unselected BLs due to weak grounding of the unselected BLs, and/or boost leakage due to improper SGD shut-off. As another example, during readout or programming-verification, excessive lowering of the BL voltage may increase read noise.

Consider, for example, memory blocks 24A and 24B of FIG. 1. In the present example, block 24A is fully functional: SGDs 40 of all strings 32A, 32B, 32C . . . are cut-off and do not conduct current when block 24A is unselected (e.g., when the DSL voltage of block 24A is set to zero). In block 24B, on the other hand, string 36C is faulty: SGD 40 of string 36C conducts current even when block 24B is unselected (e.g., when the DSL voltage of block 24B is set to zero).

As explained above, this failure may render the entire plane unusable because the BL and SL are common to all the blocks in the plane. In particular, block 24A that is by itself fully functional, may be rendered unusable due to the failure in block 24B. In various embodiments, control circuitry 22 takes different measures for detecting such failure and for localizing their impact to the faulty block or sub-block.

Figure 2:
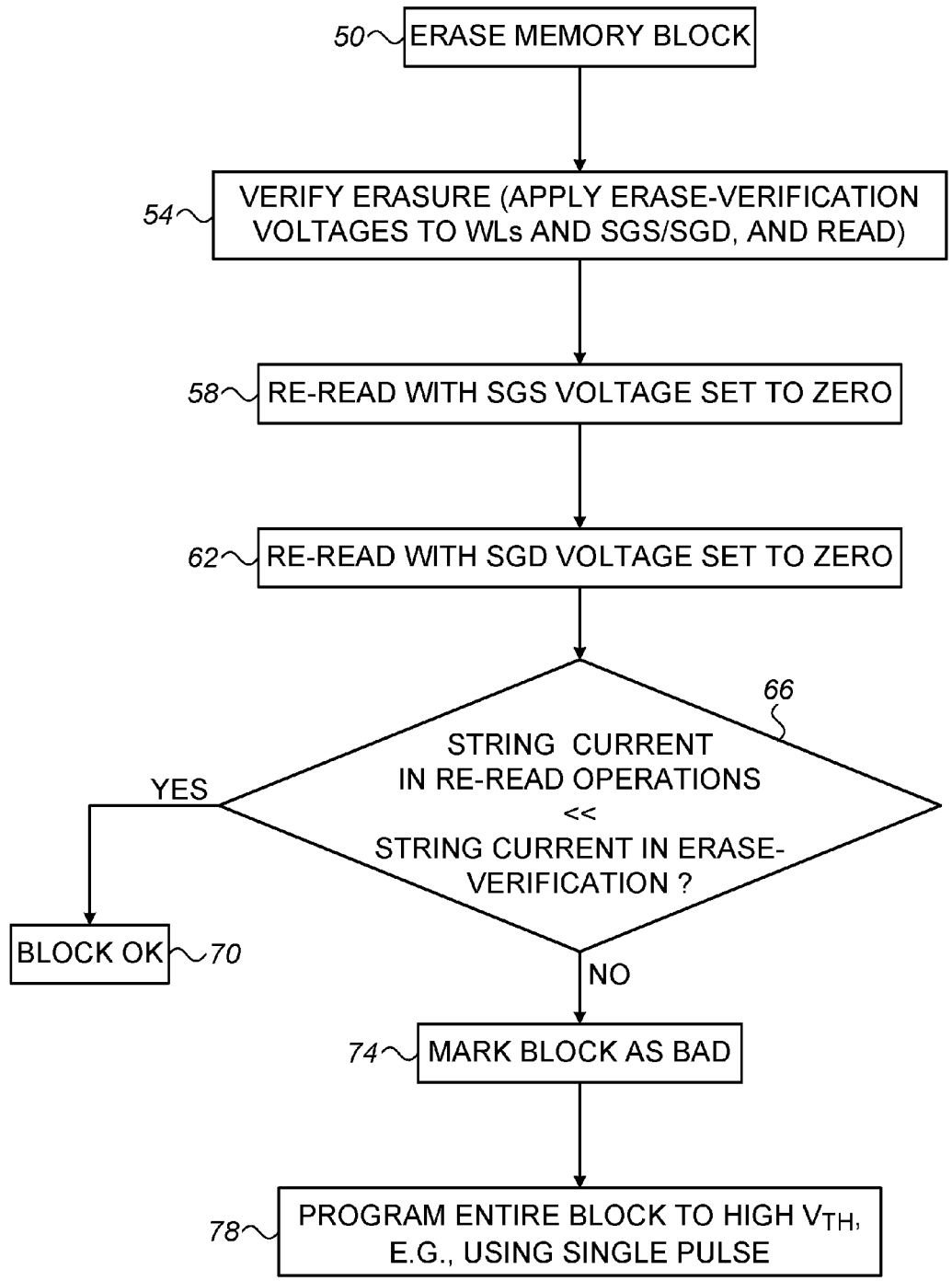
FIG. 2 is a flow chart that schematically illustrates a method for identifying and localizing SGS/SGD failures, in accordance with an embodiment that is described herein.

FIG. 2 is a flow chart that schematically illustrates a method for identifying and localizing SGS/SGD failures in memory device 20, in accordance with an embodiment that is described herein. The method of FIG. 2 describes one example implementation. Several variations and generalizations are suggested further below.

The method begins with control circuitry 22 erasing a certain memory block, at an erasure step 50. Following erasure, control circuitry 22 verifies that the block has been erased properly, at an erasure verification step 54. In an embodiment, control circuitry 22 verifies the erasure by applying a predefined low positive voltage (e.g., between 0-2V) to all the WLs in the block, applying a predefined higher voltage (e.g., 5V) to the DSL and SSL lines (and thus to the SGD and SGS gates). Under these conditions, the control circuitry senses the currents flowing through the strings of the block. (The current flowing through a string is also referred to herein simply as "string current" for brevity.)

The control circuitry then performs two re-read operations. At a first re-reading step 54, the control circuitry applies zero volts to the SSL line, i.e., sets the SGS gate voltages to zero, and senses the string currents. At a second re-reading step 58, the control circuitry returns the SSL voltage to the voltage used during erase verification, applies zero volts to the DSL line, i.e., sets the SGD gate voltages to zero, and again senses the string currents.

Typically, the erase-verification operation and the two re-read operations are each performed in parallel to all the strings in the block. The re-read operations are typically short relative to the overall block-erase duration (e.g., 50 µS relative to 4-10 mS), and therefore the latency overhead of the disclosed technique is minimal.

At a comparison step 66, the control circuitry compares the string currents sensed during the erase-verification operation to the string currents sensed during the re-read operations. In a functional string, the string current during re-read is expected to be significantly lower than the current during erase verification (e.g., 10 nA vs. ~50-100 nA).

Thus, if for a given string, the string current sensed during the first re-read operation (step 58 in which the SGS voltage set to zero) is not sufficiently lower than the string current sensed during erase verification (e.g., lower by less than some predefined margin), the control circuitry concludes that the string is faulty due to SGS failure (e.g., SGS Hi-Z).

Similarly, if for a given string, the string current sensed during the second re-read operation (step 62 in which the SGD voltage set to zero) is not sufficiently lower than the string current sensed during erase verification (e.g., lower by less than some predefined margin), the control circuitry concludes that the string is faulty due to SGD failure (e.g., SGD Hi-Z).

If the current comparison at step 66 concludes that all strings are functional (string current during re-read<<string current during erase verification, for all strings) control circuitry 22 declares the memory block functional, and the method terminates, at a success termination step 70.

If, on the other hand, the current comparison finds at least one string in which the above condition is not met, the control circuitry marks the memory block as a bad block, at a bad block marking step 74. The control circuitry then programs the entire memory block from its erased state to some positive threshold voltage, at a programming step 78.

In an example embodiment, the erased memory cells have a threshold voltage of −2V, and step 78 programs them to a positive voltage of between 1-2V. Alternatively, however, any other suitable voltages can be used. Typically, the positive voltage is chosen to be higher than the programming-verification threshold of the first programming level used for programming data into memory cells 28.

The programming in step 78 reduces the current flowing through the strings considerably. As a result, when this block is unselected, BL current leakage via the block will be reduced, even though one or more of the SGDs or SGSs in the block are faulty and conduct when unselected.

Thus, programming step 78 localizes (confines) the failure to the specific block, and prevents the failure from affecting other blocks that share the same BL and SL.

In an embodiment, control circuitry 22 initiates step 78 autonomously in response to detecting failure at step 66. In another embodiment, upon detecting failure at step 66, the control circuitry notifies the memory controller or host of the failure, and the memory controller or host initiates programming at step 78.

As noted above, the flow of FIG. 2 is an example flow. The disclosed technique can be implemented in various alternative ways. For example, it is not mandatory to perform the erase-verification operation and the two re-read operations in the order they appear in FIG. 2. In other words, steps 54, 58 and 62 may be performed in any desired order.

As another example, instead of carrying out two re-read operations, control circuitry 22 may carry out only a single re-read operation in which both the DSL voltage and the SSL voltage (i.e., both SGD and SGS gate voltages) are set to zero. Two separate re-read operations enable the control circuitry to isolate whether the failure is related to the SGS or SGD. A single re-read operation still enables the control circuitry to declare the block as bad and localize the failure, but without pin-pointing the failure.

As another example, at step 78 it is not mandatory to program the entire block. In order to prevent leakage, it is typically sufficient to program one or more WLs, ensuring that each string has at least one memory cell that is programmed to high threshold voltage.

In some embodiments, the method of FIG. 2 is applied to sub-blocks instead of blocks. In such an implementation, control circuitry declares sub-blocks as faulty or functional, and localizes the failure to a specific sub-block. In particular, other sub-blocks in the same block remain functional. This sort of implementation may require coordination between the memory device and the memory controller or host, for managing functional vs. bad sub-blocks instead of entire blocks.

In some embodiments, control circuitry 22 comprises a programming-and-verification (P&V) circuit that programs memory cells 28 with data and verifies whether the memory cells have reached their target programming levels. The control circuitry may use the same P&V circuit for verifying whether a given SGS or SGD suffers from Hi-Z failure or not.

The techniques described herein are particularly useful in 3D memory, as opposed to two-dimensional (2D) memory, because Hi-Z related defects on select-transistors and select-lines are much more common in 3D memories. First of all, in many 3D memory configurations the gate-width of the SGD and SGS transistors is similar to the gate-width of the memory cells (unlike 2D memory in which the SGD and SGS transistor gates are much wider than the memory-cell gates). Moreover, as noted above, in some 3D memory configurations the strings are "folded" so that the SGD and SGS transistors are very close to one another. This proximity increases the likelihood of Hi-Z failures on SGD and SGS transistors of the same BL or string. Nevertheless, although the embodiments described herein mainly address 3D memory, the methods and systems described herein can also be used in 2D NAND Flash memory.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   a memory, comprising multiple memory blocks, each memory block comprising multiple strings of memory cells, wherein each string is selectable using at least a respective select transistor; and
   control circuitry, which is configured to sense a current flowing through a given string in a given memory block of the memory, to detect, based on the sensed current, a failure in the given memory block that causes the given string to conduct even when the given string is unselected using the respective select transistor, and to initiate a corrective action in response to the identified failure in the given memory block.

2. The apparatus according to claim 1, wherein the select transistor comprises a source-select transistor (SGS) or a drain-select transistor (SGD).

3. The apparatus according to claim 1, wherein the control circuitry is configured to sense the current following erasure of the given memory block.

4. The apparatus according to claim 1, wherein the control circuitry is configured to perform an erase-verification operation during which a gate of the select transistor is set to a positive voltage, to perform a re-read operation in which the gate is set to zero voltage, and to detect the failure by comparing the current sensed during the erase-verification operation to the current sensed during the re-read operation.

5. The apparatus according to claim 4, wherein the control circuitry is configured to detect the failure by detecting that the current sensed during the re-read operation is lower than the current sensed during the erase-verification operation by less than a predefined margin.

6. The apparatus according to claim 1, wherein the control circuitry comprises a programming-and-verification (P&V) circuit for verifying programming of the memory cells with data, and wherein the control circuitry is configured to sense the current using the P&V circuit.

7. The apparatus according to claim 6, wherein the corrective action comprises programming of at least some of the memory cells in the given memory block to a positive threshold voltage.

8. The apparatus according to claim 7, wherein the control circuitry is configured to program the memory cells by applying to each of the memory cells a single programming pulse.

9. The apparatus according to claim 7, wherein the control circuitry is configured to notify a memory controller or host of the failure, and to receive from the memory controller or host an instruction to program the memory cells.

10. A method, comprising:
    in a memory, which comprises multiple memory blocks, each memory block comprising multiple strings of memory cells, wherein each string is selectable using at least a respective select transistor, sensing a current flowing through a given string in a given memory block of the memory;
    based on the sensed current, detecting a failure in the given memory block that causes the given string to conduct even when the given string is unselected using the respective select transistor; and
    initiating a corrective action in response to the identified failure in the given memory block.

11. The method according to claim 10, wherein the select transistor comprises a source-select transistor (SGS) or a drain-select transistor (SGD).

12. The method according to claim 10, wherein sensing the current comprises assessing the current following erasure of the given memory block.

13. The method according to claim 10, wherein sensing the current comprises performing an erase-verification operation during which a gate of the select transistor is set to a positive voltage, and performing a re-read operation in which the gate is set to zero voltage, and wherein detecting the failure comprises comparing the current sensed during the erase-verification operation to the current sensed during the re-read operation.

14. The method according to claim 13, wherein detecting the failure comprises detecting that the current sensed during the re-read operation is lower than the current sensed during the erase-verification operation by less than a predefined margin.

15. The method according to claim 10, wherein sensing the current comprises assessing the current using a programming-and-verification (P&V) circuit that is also used for verifying programming of the memory cells with data.

16. The method according to claim 10, wherein initiating the corrective action comprises initiating programming of at least some of the memory cells in the given memory block to a positive threshold voltage.

17. The method according to claim 16, wherein programming of the memory cells comprises applying to each of the memory cells a single programming pulse.

18. The method according to claim 16, wherein initiating the programming comprises notifying a memory controller or host of the failure, and receiving from the memory controller or host an instruction to program the memory cells.

* * * * *